United States Patent
Park et al.

(10) Patent No.: US 9,065,291 B2
(45) Date of Patent: Jun. 23, 2015

(54) APPARATUS FOR MANAGING SECONDARY BATTERY

(75) Inventors: Jae-Dong Park, Daejeon (KR);
Tae-Joong Lee, Daejeon (KR);
Ju-Young Kim, Daejeon (KR);
Jong-Kyung Ko, Seoul (KR)

(73) Assignee: LG CHEM, LTD., Seoul (KR)

( * ) Notice: Subject to any disclaimer, the term of this patent is extended or adjusted under 35 U.S.C. 154(b) by 364 days.

(21) Appl. No.: 13/552,678

(22) Filed: Jul. 19, 2012

(65) Prior Publication Data

US 2012/0286575 A1 Nov. 15, 2012

Related U.S. Application Data

(63) Continuation of application No. PCT/KR2011/001442, filed on Mar. 2, 2011.

(30) Foreign Application Priority Data

Aug. 13, 2010 (KR) ........................ 10-2010-0078414

(51) Int. Cl.
*H02J 7/00* (2006.01)
*H01M 10/48* (2006.01)
(Continued)

(52) U.S. Cl.
CPC ............ *H02J 7/0068* (2013.01); *Y10T 307/406* (2015.04); *G01R 31/3658* (2013.01);
(Continued)

(58) Field of Classification Search
USPC ....................................................... 320/134
See application file for complete search history.

(56) References Cited

U.S. PATENT DOCUMENTS 6,204,637 B1 * 3/2001 Rengan .................... 320/137
7,602,146 B2 * 10/2009 Carrier et al. ............ 320/134
(Continued)

FOREIGN PATENT DOCUMENTS

JP 7-107674 A 4/1995
JP 2003-234055 A 8/2003
(Continued)

OTHER PUBLICATIONS

International Search Report issued in PCT/KR2011/001442, mailed on Nov. 30, 2011.
Written Opinion of the International Searching Authority issued in PCT/KR2011/001442, mailed on Nov. 30, 2011.

*Primary Examiner* — Edward Tso
*Assistant Examiner* — Robert Grant
(74) *Attorney, Agent, or Firm* — Birch, Stewart, Kolasch & Birch, LLP

(57) ABSTRACT

Disclosed is a secondary battery management apparatus including a current control switch for opening and closing the flow of charge or discharge current of a secondary battery; a connector for selectively providing a power conducting state and a power cutoff state based on whether the apparatus is connected to a charge/discharge device; a communication terminal for providing a communication interface with the charge/discharge device; a power supply for receiving power from the secondary battery and supplying the received power to a component that requires electrical power; a power supply line including a power supply switch; a switch controller for detecting the reception of a communication request signal through the communication terminal during connection to the charge/discharge device through the connector and transmitting a turn-on signal to the power supply switch; and a controller connected to the power supply and initiating or terminating a management operation for the battery.

9 Claims, 3 Drawing Sheets

(51) Int. Cl.
  *B60L 3/04*   (2006.01)
  *B60L 11/18*  (2006.01)
  *B60L 11/00*  (2006.01)
  *G01R 31/36*  (2006.01)

(52) U.S. Cl.
  CPC ............. *H01M10/48* (2013.01); *B60L 3/04* (2013.01); *B60L 11/1859* (2013.01); *B60L 11/1864* (2013.01); *B60L 11/1872* (2013.01); *B60L 2200/12* (2013.01); *B60L 2240/545* (2013.01); *B60L 2240/547* (2013.01); *B60L 2240/549* (2013.01); *H02J 2007/004* (2013.01); *B60L 11/007* (2013.01); *B60L 11/1818* (2013.01); *B60L 11/1861* (2013.01); *Y02T 10/7044* (2013.01); *Y02T 10/7005* (2013.01); *Y02T 10/7061* (2013.01); *Y02T 90/14* (2013.01); *Y02T 90/16* (2013.01)

(56) References Cited

U.S. PATENT DOCUMENTS

| | | |
|---|---|---|
| 2003/0151868 A1 | 8/2003 | Inae et al. |
| 2006/0076934 A1 | 4/2006 | Ogata et al. |
| 2007/0216351 A1 | 9/2007 | Seki |

FOREIGN PATENT DOCUMENTS

| | | |
|---|---|---|
| JP | 2007-299696 A | 11/2007 |
| JP | 2009-112192 A | 5/2009 |
| KR | 20-0256197 Y1 | 12/2001 |
| KR | 10-2006-0019766 A | 3/2006 |
| KR | 10-2006-0044296 A | 5/2006 |
| KR | 10-0688135 B1 | 2/2007 |
| KR | 10 0849646 B1 | 7/2008 |
| KR | 10-2009-0052520 A | 5/2009 |

* cited by examiner

APPARATUS FOR MANAGING SECONDARY BATTERY

CROSS-REFERENCE TO RELATED APPLICATION

This application is a continuation of International Application No. PCT/KR2011/001442 filed on Mar. 2, 2011, which claims priority under 35 USC 119(a) to Korean Patent Application No. 10-2010-0078414 filed in the Republic of Korea on Aug. 13, 2010, the entire contents of which are incorporated herein by reference.

TECHNICAL FIELD

The present disclosure relates to a secondary battery management apparatus, and more particularly, to a secondary battery management apparatus which can prevent power consumption when a management operation for a secondary battery is not required.

BACKGROUND ART

Recently, secondary batteries are widely used in mobile devices such as notebooks, mobile phones, etc., various power systems such as electric bicycles, electric vehicles, hybrid vehicles, etc., power backup systems for supplying backup power in the event of a power outage, large-capacity power storage devices for storing large amounts of power and supplying the stored power to other devices, etc.

Among various types of batteries, a battery using lithium is most widely used for its high energy density, high operating voltage, and long life span.

A secondary battery is used in combination with a battery management system (BMS). The battery management system serves to control the charge and discharge of the secondary battery to an appropriate level and to stop the charge or discharge of the secondary battery in the event of an abnormal situation such as overdischarge, overcharge, overcurrent, etc., thereby preventing explosion or deterioration in performance of the secondary battery.

A secondary battery management apparatus includes a microprocessor that receives power from the secondary battery to perform the above-described operations. The microprocessor does not consume a large amount of power per unit time and thus maintains its operating state even when the secondary battery is no longer in use. That is, even when the secondary battery is not in a charge or discharge mode, the microprocessor monitors the voltage, current, temperature, etc. of the secondary battery and continues to maintain the management operation. Therefore, when the secondary battery is not being used for a long period of time, the state of charge (SOC) of the secondary battery is continuously reduced by the power consumption of the microprocessor.

The reduction in SOC is not preferable in terms of unnecessary power consumption. This is because, when the secondary battery is not in the charge or discharge mode, the operation of the secondary battery management apparatus is not in fact required. Moreover, the reduction in SOC of the secondary battery may cause an overdischarge state of the secondary battery. For example, when the secondary battery is manufactured, the secondary battery is charged to a predetermined SOC (for example, 30%). However, after the secondary battery is manufactured, if the secondary battery is stored in a warehouse or export container for a long time or if the use of the secondary battery is delayed due to a long distribution period, the power of the secondary battery is exhausted by the secondary battery management apparatus, and thus the secondary battery reaches the overdischarge state.

Therefore, in the technical field to which the present disclosure pertains, a technique for controlling the supply and cutoff of operating power to the secondary battery management apparatus by detecting the time when the charge and discharge of the secondary battery should be monitored is required.

DISCLOSURE

Technical Problem

The present disclosure is designed to solve the problems of the prior art, and therefore it is an object of the present disclosure to provide a secondary battery management apparatus which can initiate the use of power supplied from a secondary battery and a management operation for the secondary battery by detecting a connection to a charge/discharge device or detecting the presence of a communication request signal from the charge/discharge device.

It is another object of the present disclosure to provide a secondary battery management apparatus which can stop the use of power supplied from a secondary battery and a management operation for the secondary battery by detecting a disconnection from a charge/discharge device or detecting the absence of a communication request signal from the charge/discharge device.

It is still another object of the present disclosure to provide a secondary battery management apparatus which can disconnect an electrical connection between a secondary battery and a charge/discharge device and stop the use of power supplied from the secondary battery when the secondary battery reaches an overdischarge state.

Other objects and advantages of the present disclosure will be understood by the following description and become more apparent from the embodiments of the present disclosure, which are set forth herein. It will be also apparent that objects and advantages of the present disclosure can be embodied easily by the components defined in claims and combinations thereof.

Technical Solution

In one aspect of the present disclosure, there is provided a secondary battery management apparatus which includes a current control switch for opening and closing the flow of charge current or discharge current of a secondary battery; a connector for providing a power conducting state and a power cutoff state during connection to and disconnection from a charge/discharge device; a power supply for receiving power from the secondary battery and supplying the received power to a component that requires electrical power; a power supply line for supplying or cutting off the power from the secondary battery to the power supply based on switching between the power conducting state and the power cutoff state; and a controller connected to the power supply and initiating or terminating a management operation for the secondary battery according to whether or not the power is provided from the power supply.

In another aspect of the present disclosure, there is provided a secondary battery management apparatus which includes a current control switch for opening and closing the flow of charge current or discharge current of a secondary battery; a connector for providing a connection interface with a charge/discharge device; a communication terminal for providing a communication interface with the charge/discharge device; a power supply for receiving power from the secondary battery and supplying the received power to a component that requires electrical power; a power supply line including a power supply switch and supplying or cutting off the power from the secondary battery to the power supply; a switch controller for detecting the reception of a communication request signal through the communication terminal during connection to the charge/discharge device through the connector and transmitting a turn-on signal to the power supply switch; and a controller connected to the power supply and initiating or terminating a management operation for the secondary battery whether or not the power is provided from the power supply.

In another aspect of the present disclosure, in the case where the switch controller detects the reception of the communication request signal and turns on the power supply switch, the connector may provide only the connecting interface with the charge/discharge device. On the contrary, in the case where the connector selectively provides the power conducting state and the power cutoff state according to the connection status with the charge/discharge device, the power supply switch may be omitted.

Preferably, the controller turns on the current control switch after initiating the management operation for the secondary battery.

Preferably, the power supply line includes a first power supply line and a second power supply line independently connected to a terminal provided in the connector, and the first power supply line and the second power supply line are electrically connected to or disconnected from each other based on whether the first power supply line and the second power supply line are connected to a power line connector provided in a counterpart connector of the charge/discharge device.

In the present disclosure, the switch controller detects the absence of the communication request signal through the communication terminal during disconnection of the apparatus from the charge/discharge device through pulling out the connector and stops the transmission of the turn-on signal.

Selectively, the switch controller measures the voltage of a line through which the charge current or discharge current of the secondary battery flows and, if the voltage is higher than a predetermined voltage level, transmits the turn-on signal to the power supply switch.

Preferably, the secondary battery management apparatus according to the present disclosure further includes a cell voltage measurement unit for measuring the cell voltage of the secondary battery and transmitting the measured cell voltage to the controller, wherein when the total voltage of the secondary battery or the voltage of a certain cell reaching an overdischarge state is detected, the controller turns off the current control switch and then turns off the power supply switch.

Advantageous Effects

According to an aspect of the present disclosure, the operation of the secondary battery management apparatus is initiated and terminated based on the connection and disconnection between the secondary battery management apparatus and the charge/discharge device, and thus it is possible to prevent the secondary battery management apparatus from consuming the power of the secondary battery while the disconnection from the charge/discharge device is maintained.

According to another aspect of the present disclosure, the operation of the secondary battery management apparatus is initiated and terminated based on the presence or absence of the communication request signal transmitted from the charge/discharge device, and thus it is possible to prevent the secondary battery management apparatus from consuming the power of the secondary battery while the disconnection from the charge/discharge device is maintained.

According to another aspect of the present disclosure, the operation of the secondary battery management apparatus is stopped after the overdischarge protection operation for the secondary battery is performed, and thus it is possible to prevent the secondary battery management apparatus from consuming the power of the secondary battery after the overdischarge protection operation for the secondary battery is performed.

DESCRIPTION OF DRAWINGS

Other objects and aspects of the present disclosure will become apparent from the following descriptions of the embodiments with reference to the accompanying drawings in which.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
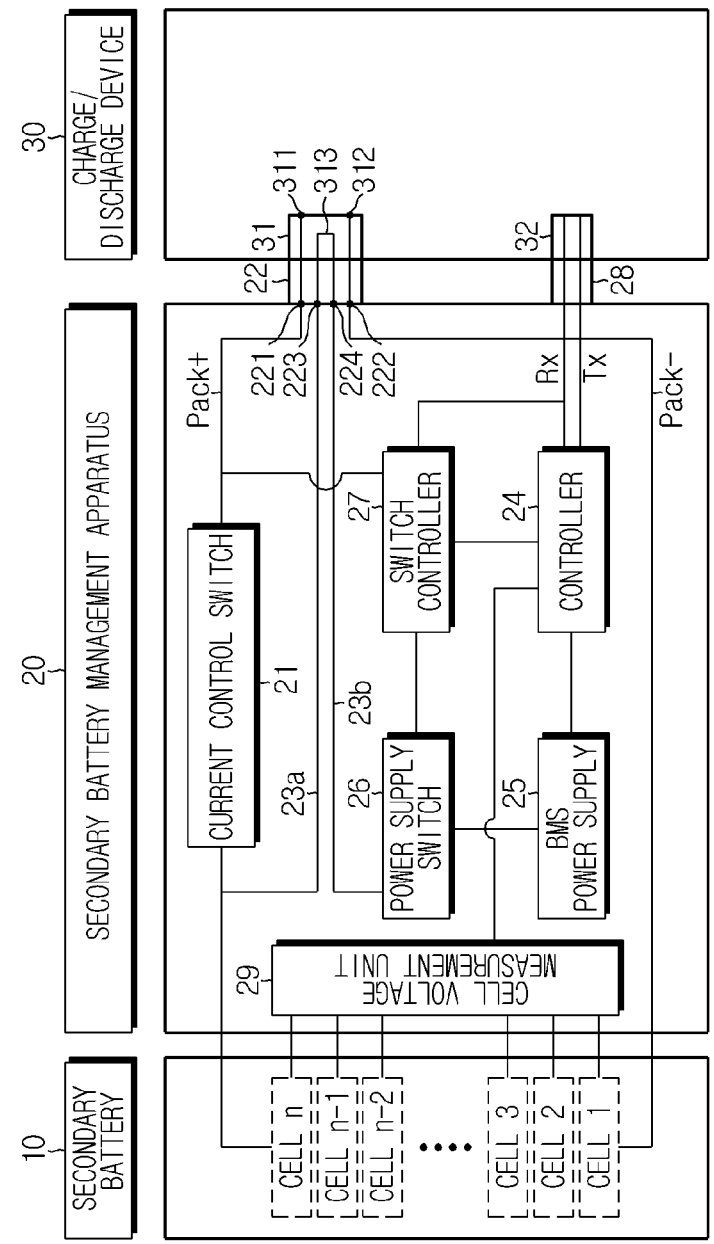
FIG. 1 is a block diagram showing the configuration of a secondary battery management apparatus in accordance with a preferred embodiment of the present disclosure, which is connected to a charge/discharge device.

FIG. 1 is a block diagram showing the configuration of a secondary battery management apparatus 20 in accordance with a preferred embodiment of the present disclosure, which is connected to a charge/discharge device 30.

Referring to FIG. 1, a secondary battery management apparatus 20 is connected to a secondary battery 10 including a plurality of cells and serves to control the charge and discharge of the secondary battery 10 and to protect the secondary battery in the event of an abnormal situation such as overdischarge, overcharge, overcurrent, etc.

The secondary battery management apparatus 20 includes a current control switch 21, a connector 22, power supply lines 23a and 23b, and a controller 24.

The current control switch 21 opens and closes a path, through which charge current or discharge current of the secondary battery 10 flows, under the control of the controller 24. When the current control switch 21 is turned on, the charge current flows from the charge/discharge device 30 to the secondary battery 10 in a charge mode and the discharge current flows from the secondary battery 10 to the charge/discharge device 30 in a discharge mode. On the contrary, when the current control switch 21 is turned off, the charge current flowing to the secondary battery 10 is cut off in the charge mode, and the discharge current flowing to the charge/discharge device 30 is cut off in the discharge mode. The current control switch 21 may be implemented as a semiconductor device, such as a field-effect transistor (FET), or a relay device. However, the present disclosure is not limited by the type of current control switch 21.

The connector 22 provides a mechanical connecting interface with the charge/discharge device 30. Thus, the connector 22 is connected to a counterpart connector 31 provided in the charge/discharge device 30. The connector 22 and the counterpart connector 31 may be respectively a female connector and a male connector or vice versa. The connection structure formed by the connector 22 and the counterpart connector 31 may include any connection structure that can be used for the transmission of electrical signals between different devices. The connector includes terminal 221 and 222 connected to a high potential line Pack+ and a low potential line Pack–, a terminal 223 connected to a first power supply line 23a branched from the high potential line Pack+, and a terminal 224 connected to a second power supply line 23b connected to a component to which power from the secondary battery 10 is supplied. The counterpart connector 31 includes terminals 311 and 312 connected to lines of the charge/discharge device 30 corresponding to the high potential line Pack+ and the low potential line Pack– and a power line connector 313 for electrically connecting the first power supply line 23a and the second power supply line 23b when the connector 22 and the counter connector 31 are connected to each other. When the connector 22 and the counterpart connector 31 are disconnected from each other, the electrical connection between the first power supply line 23a and the second power supply line 23b is automatically disconnected since the power line connector 313 dose not maintain connection between the first power supply line 23a and the second power supply line 23b. As a result, the power supplied from the secondary battery 10 is not supplied to the secondary battery management apparatus 20, and thus the operation of the secondary battery management apparatus 20 is automatically stopped.

Figure 2:
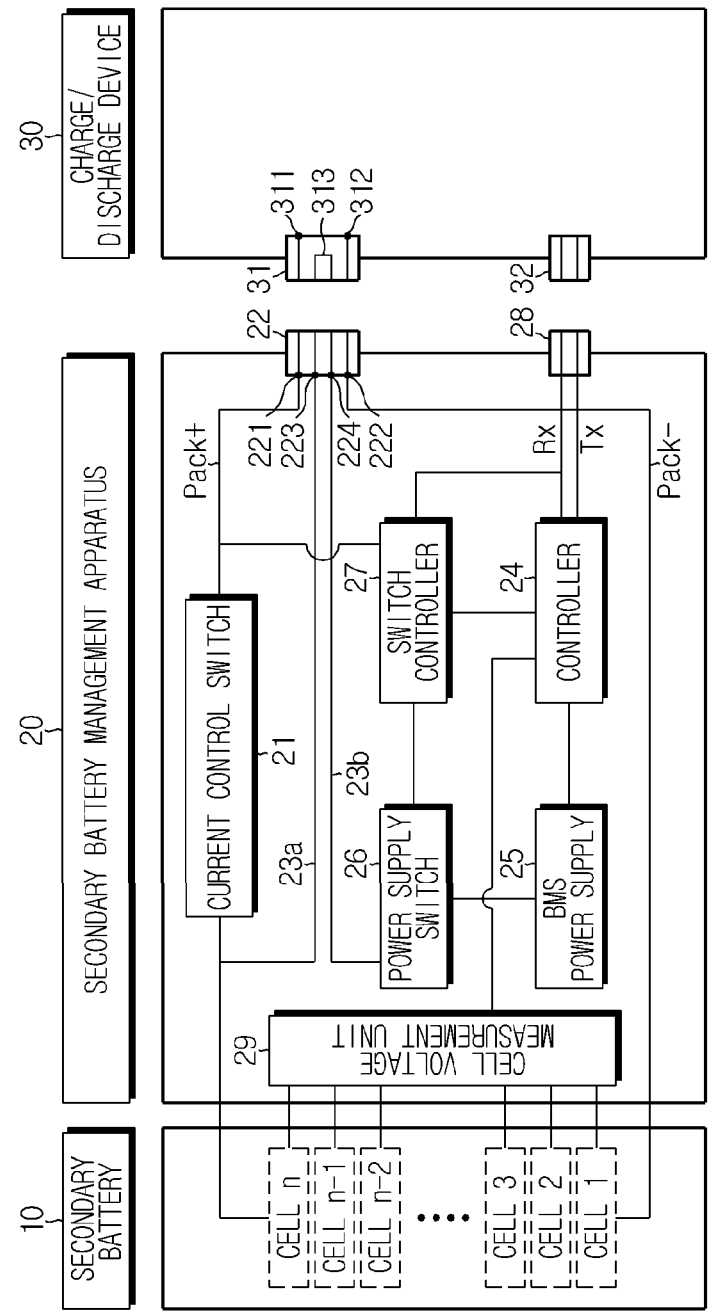
FIG. 2 is a block diagram showing a secondary battery management apparatus in accordance with a preferred embodiment of the present disclosure, which is disconnected from a charge/discharge device.

FIG. 2 is a diagram showing that the electrical connection between the first power supply line 23a and the second power supply line 23b is disconnected by the power line connector 313 of the counterpart connector 31 as the secondary battery management apparatus 20 and the charge/discharge device 30 are disconnected from each other by pulling out the connector 22 from the counterpart connector 31 or vice versa.

The state, in which the power of the secondary battery can be supplied to the secondary battery management apparatus 20 since the first power supply line 23a and the second power supply line 23b are electrically connected by the power line connector 313 when the connector 22 and the counterpart connector 31 are connected to each other, will be hereinafter referred to as a "power conducting state". Moreover, the state, in which the power of the secondary battery 10 cannot be supplied to the secondary battery management apparatus 20 since the electrical connection between the first power supply line 23a and the second power supply line 23b is disconnected by the power line connector 313 when the connector 22 and the counterpart connector 31 are disconnected from each other, will be hereinafter referred to as a "power cutoff state". Further, since the power conducting state and the power cutoff state are determined based on the connection and disconnection between the connector 22 and the counterpart connector 31, it can be understood that the connector 22 provides the power conducting state and the power cutoff state to the power supply lines 23a and 23b.

The method of providing the power conducting state and the power cutoff state to the power supply lines 23a and 23b is not limited to the above-described method. Thus, it should be understood that any configuration that can implement the electrical connection or disconnection between the first power supply line 23a and the second power supply line 23b according to the connection or disconnection between the connector 22 and the counterpart connector 31 will fall within the scope of the present disclosure. For example, contacts of a mechanical relay for switching the connection between the first power supply line 23a and the second power supply line 23b may be provided on a surface where the connector 22 and the counterpart connector 31 are connected to each other such that the contacts of the relay are connected to each other when the connector 22 and the counterpart connector 31 are connected to each other and the contacts of the relay are disconnected from each other when the connector 22 and the counterpart connector 31 are disconnected from each other.

When the power supply lines 23a and 23b are in the power conducting state according to the connection of the connector 22 to the counterpart connector 31, the power from the secondary battery 10 is supplied to a BMS power supply for supplying power to a component that requires electrical power among various components included in the secondary battery management apparatus 20. On the contrary, when the power supply lines 23a and 23b are in the power cutoff state according to the disconnection of the connector 22 from the counterpart connector 31, the power supply from the secondary battery 10 to the BMS power supply 25 is cut off.

In the power conducting state, the controller 24 receives operating power from the BMS power supply 25 and initiates the management operation for the secondary battery 10. That is, the controller 24 initiates a program required for the management operation for the secondary battery 10 and then turns on the current control switch 21. Next, the controller 24 controls the charge and discharge of the secondary battery 10 and performs various protection operations for the secondary battery 10. On the contrary, in the power cutoff state, the controller 24 cannot receive the operating power from the BMS power supply 25. Thus, the controller 24 stops the management operation for the secondary battery 10. As a result, in the power cutoff state, the power consumption of the secondary battery 10 is prevented by the operation of the secondary battery management apparatus 20. The controller 24 may be implemented as a semiconductor device such as a microprocessor, but the present disclosure is not limited thereto.

Although not necessary, the secondary battery management apparatus 20 may further include a communication terminal 28 capable of transmitting and receiving a communication signal to and from the charge/discharge device 30. When the communication terminal 28 is provided in the secondary battery management apparatus 20, a counterpart communication terminal 32 is preferably provided in the charge/discharge device 30, and the communication terminal is preferably connected to and disconnected from the counterpart communication terminal 32. The communication terminal 28 is connected to the counterpart communication terminal 32 to form a communication interface.

The controller 24 may periodically communicate with the charge/discharge device 30 through the communication interface formed by the connection of the communication terminal 28 to the counterpart communication terminal 32. That is, the charge/discharge device 30 can transmit a communication request signal to the secondary battery management apparatus 20 through the communication interface at regular intervals. Thus, the controller 24 periodically receives the communication request signal and then transmits data required by the charge/discharge device 30 through the communication interface. The data that can be transmitted by the controller 24 may include the voltage of the secondary battery 10, the magnitude of charge current or discharge current, the temperature of the secondary battery 10, the voltage and current profiles of the secondary battery 10, the state of charge (SOC) of the secondary battery, etc. However, the present disclosure is not limited by the type of information transmitted through the communication interface.

In an alternative embodiment, the secondary battery management apparatus 20 may initiate the management operation for the secondary battery 10 based on whether the communication request signal is received through the communication terminal 28. That is, when the communication request signal is received through the communication terminal 28, the secondary battery management apparatus 20 receives the operating power from the secondary battery 10 through the power supply lines 23a and 23b to initiate the management operation.

In order to achieve the above-described functions, the secondary battery management apparatus 20 may further include a power supply switch 26 provided on the second power supply line 23b. Of course, the power supply switch 26 may be provided on the first power supply line 23a. The power supply switch 26 may be implemented as a semiconductor device, such as a field-effect transistor, or a relay device. However, the present disclosure is not limited by the type of power supply switch 26. Moreover, the secondary battery management apparatus 20 may further include a switch controller 27 which detects the reception of the communication request signal transmitted from the charge/discharge device 30 through the communication terminal 28 and transmits a turn-on signal to the power supply switch 26. When the communication request signal is not received through the communication terminal 28 due to the disconnection of the secondary battery management apparatus 20 from the charge/discharge device 30, the switch controller 27 detects it and stops the transmission of the turn-on signal to the power supply switch 26. Then, the power supply switch 26 is turned off, and the power from the secondary battery 10 is not supplied to the BMS power supply 25, thereby preventing the power consumption of the secondary battery 10.

Although not necessary, the switch controller 27 may detect a voltage of the high potential line Pack+ through which the charge current or discharge current of the secondary battery 10 flow and, if the voltage is higher than a predetermined voltage level, transmits the turn-on signal to the power supply switch 26. Here, the predetermined voltage level can be determined by trial and error in advance.

The secondary battery management apparatus 20 may monitor the voltage of the secondary battery 10. As a result, if the total voltage of the secondary battery 10 or the voltage of a certain cell is reduced to the lowest limit, the secondary battery management apparatus 20 may perform an overdischarge protection operation and then stop the battery management operation. In this case, the controller 24 may determine whether the total voltage of the secondary battery 10 or the voltage of a certain cell is reduced to the lowest limit to cause the overdischarge state based on cell voltage data measured by a cell voltage measurement unit 29. If it is determined that the overdischarge state occurs, the controller 24 turns off the current control switch 21 to stop the flow of the discharge current and controls the switch controller 27 to turn off the power supply switch 26. Then, the operating power supplied to the BMS power supply is cut off, and thus the operation of the secondary battery management apparatus 20 is stopped, thereby preventing the power consumption of the secondary battery 10.

The charge/discharge device 30 is a device that supplies the charge current to the secondary battery 10 in the charge mode and receives the discharge current from the secondary battery 10 in the discharge mode.

Figure 3:
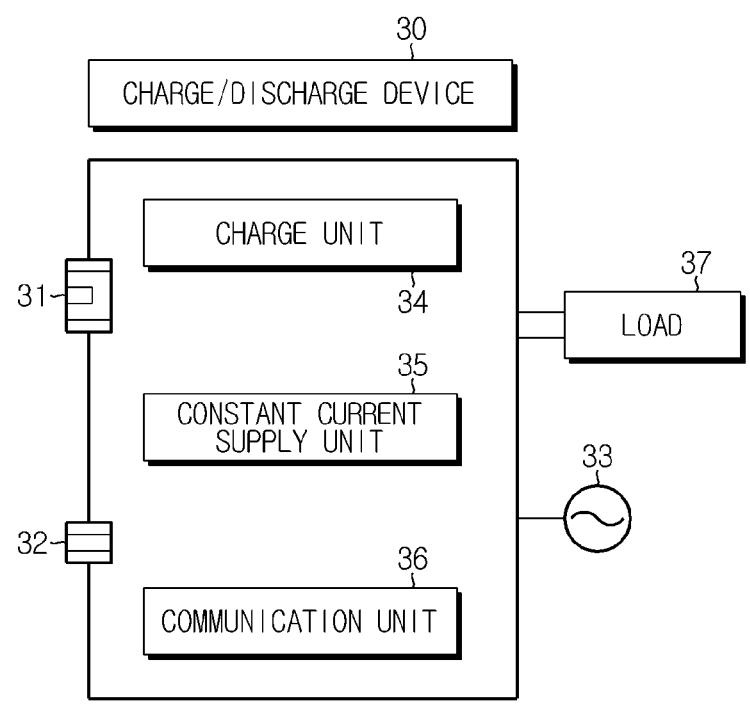
FIG. 3 is a schematic block diagram showing the configuration of a charge/discharge device in accordance with a preferred embodiment of the present disclosure.

FIG. 3 is a schematic block diagram showing the configuration of the charge/discharge device 30 in accordance with a preferred embodiment of the present disclosure.

Referring to FIG. 3, in order to supply the charge current, the charge/discharge device 30 may include a charge unit 34 that receives commercial AC power 33 and generates the charge current. Alternatively, the charge/discharge device 30 may further include a constant current supply unit 35 that receives the commercial AC power 33, generates DC power, and supplies the DC power to its load or an external load 37. Alternatively, the charge/discharge device 30 may further include a communication unit 36 that requests and receives battery status information from the secondary battery management apparatus 20 and transmits the received information to an external management apparatus such as a monitoring server through wired and wireless networks.

Although not necessary, the secondary battery management apparatus 20 and the charge/discharge device 30 may constitute a power backup system for the load 37 in combination with each other. That is, in a normal state, the charge/discharge device 30 receives the commercial AC power 33, converts the commercial AC power 33 into DC power, and supplies the DC power to the load 37. In parallel with this, the charge/discharge device 30 converts the commercial AC power 33 into DC power and supplies the DC power to the secondary battery 10, thus charging the secondary battery 10. Meanwhile, when the supply of the commercial AC power is cut off due to a power outage, for example, the charge/discharge device 30 receives the discharge current from the secondary battery 10, converts the discharge current into DC power at an appropriate level required by the load 37, and supplies the DC power to the load 37.

In order to achieve the above-described functions, the secondary battery management apparatus 20 monitors the voltage of the high potential line Pack+ and, if it is determined that the power is not supplied due to the power outage, allows the current control switch 21 to operate in a discharge mode, thereby supplying the discharge current from the secondary battery 10 to the charge/discharge device 30. When the discharge current is continuously supplied, the state of charge of the secondary battery 10 is reduced to the lowest limit. In this case, the controller 24 of the secondary battery management apparatus 20 turns off the current control switch 21 and turns off the power supply switch 26 by controlling the switch controller 27 to stop the operation of the secondary battery management apparatus 20, thereby preventing the power consumption of the secondary battery 10.

According to the above-described embodiment, it has been described that the operation of the secondary battery management apparatus 20 is basically initiated or terminated by the connection or disconnection between the connector 22 of the secondary battery management apparatus 20 and the counterpart connector 31 of the charge/discharge device 30 and is further initiated or terminated by detecting the reception of the communication request signal from the charge/discharge device 30 through the communication terminal 28.

However, the opposite embodiment is also possible. That is, the operation of the secondary battery management apparatus 20 is basically initiated or terminated by the connection or disconnection between the communication terminal 28 of the secondary battery management apparatus 20 and the counterpart communication terminal 32 of the charge/discharge device 30 and is further initiated or terminated by the connection or disconnection between the connector 22 of the secondary battery management apparatus 20 and the counterpart connector 31 of the charge/discharge device 30.

Moreover, it will be apparent to those skilled in the art to which the present disclosure pertains that either or both of the on-off control of the secondary battery management apparatus 20 based on the connection or disconnection between the connector 22 and the counterpart connector 31 and the on-off control of the secondary battery management apparatus 20 based on the reception of the communication request signal through the communication terminal 28 may be used.

According to the present disclosure, when the charge/discharge device is disconnected from the secondary battery management apparatus, the power from the secondary battery is not supplied through the power supply line, and thus it is possible to prevent the power consumption of the secondary battery even when the secondary battery is left for a long time. Moreover, the power supplied from the secondary battery through the power supply line is cut off when the voltage of the secondary battery is reduced to a predetermined level, even when the secondary battery is left for a long time while the connection between the secondary battery management apparatus and the charge/discharge device is maintained, and thus it is possible to prevent the secondary battery from being overdischarged. Furthermore, in the event of a power outage, the power is supplied to the charge/discharge device by the discharge of the secondary battery, and thus the charge/discharge device operates normally for a predetermined time. However, when the voltage of the secondary battery is reduced to a predetermined level by the discharge of the secondary battery, the power consumption of the secondary battery management apparatus is stopped, and thus it is possible to prevent the secondary battery from being overdischarged during the power outage. Moreover, when the power outage is over, the operation of the charge/discharge device is started by the commercial AC power, the communication request signal is received through the communication terminal, the voltage at an appropriate level is maintained in the high potential terminal Pack+, and thus the operation of the secondary battery management apparatus starts to initiate the charging and protection operations for the secondary battery. Meanwhile, before the secondary battery is first used, the charge/discharge device is not connected to the secondary battery management apparatus, and thus the power supply to the secondary battery management apparatus is cut off, thereby preventing the power consumption of the secondary battery. In all of the above-described embodiments, it will be apparent to those skilled in the art to which the present disclosure pertains that the control method of monitoring the voltage of the high potential line Pack+ through which the charge current or discharge current of the secondary battery flow and, if the voltage is at an appropriate level, maintaining the operation of the secondary battery management apparatus may be selectively used.

Moreover, although it has been described that the controller 24 and the switch controller 27 of the secondary battery management apparatus 20 are separate components in all of the above-described embodiments, it will be apparent to those skilled in the art to which the present disclosure pertains that they are functionally separated from each other and may be integrated into a single component.

Furthermore, it has been described that the connector 22 and the communication terminal 28 are separate components in the above-described embodiment. However, the connector 22 and the communication terminal 28 may be integrated into a single component. That is, the communication terminal 28 may be integrated into the connector 22, and vice versa. In this case, it will be apparent that the connector 22 and the communication terminal 28 should be understood as a sub-component included in a single component.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A secondary battery management apparatus comprising:
   a controller configured to implement a management operation for a secondary battery;
   a current control switch for opening and closing the flow of charge current or discharge current of the secondary battery;
   a connector for providing a connection interface with a charge/discharge device;
   a communication terminal for providing a communication interface with the charge/discharge device;
   a power supply for receiving power from the secondary battery and supplying the received power to the controller;
   a power supply line including a power supply switch and supplying or cutting off the power from the secondary battery to the power supply; and
   a switch controller connected to the communication terminal and configured to transmit a turn-on signal to the power supply switch when detecting reception of a communication request signal through the communication terminal and stop transmitting the turn-on signal to the power supply switch when not detecting the reception of the communication request signal,
   wherein the controller is connected to the power supply and initiates or terminates a management operation for the secondary battery according to whether or not the power is provided from the power supply.

2. The secondary battery management apparatus of claim 1, wherein the controller turns on the current control switch after initiating the management operation for the secondary battery.

3. The secondary battery management apparatus of claim 1, wherein the power supply line comprises a first power supply line and a second power supply line independently connected to a terminal provided in the connector, and
   wherein the first power supply line and the second power supply line are electrically connected to or disconnected from each other based on whether the first power supply line and the second power supply line are connected to a power line connector provided in a counterpart connector of the charge/discharge device.

4. The secondary battery management apparatus of claim 3, wherein the power supply switch is provided on the first power supply line or on the second power supply line.

5. The secondary battery management apparatus of claim 1, wherein the connector provides a power conducting state and a power cutoff state during connection to and disconnection from the charge/discharge device, and wherein the power supply line supplies or cuts off the power from the secondary battery to the power supply based on switching between the power conducting state and the power cutoff state.

6. The secondary battery management apparatus of claim 1, wherein the switch controller detects the absence of the communication request signal through the communication terminal during disconnection from the charge/discharge device through the connector and stops the transmission of the turn-on signal.

7. The secondary battery management apparatus of claim 1, wherein the switch controller measures the voltage of a line through which the charge current or discharge current of the secondary battery flows and, if the voltage is at an appropriate level, transmits the turn-on signal to the power supply switch.

8. A secondary battery management apparatus comprising:
a current control switch for opening and closing the flow of charge current or discharge current of a secondary battery;
a connector for providing a connection interface with a charge/discharge device;
a communication terminal for providing a communication interface with the charge/discharge device;
a power supply for receiving power from the secondary battery and supplying the received power to a component that requires electrical power;
a power supply line including a power supply switch and supplying or cutting off the power from the secondary battery to the power supply;
a switch controller for detecting the reception of a communication request signal through the communication terminal during connection to the charge/discharge device through the connector and transmitting a turn-on signal to the power supply switch;
a controller connected to the power supply and initiating or terminating a management operation for the secondary battery according to whether or not the power is provided from the power supply; and
further comprising a cell voltage measurement unit for measuring the cell voltage of the secondary battery and transmitting the measured cell voltage to the controller,
wherein when the total voltage of the secondary battery or the voltage of a certain cell reaching an overdischarge state is detected, the controller turns off the current control switch and then turns off the power supply switch.

9. A secondary battery management apparatus comprising:
a connector for providing a connection interface with a charge/discharge device;
a current control switch for opening and closing the flow of charge current or discharge current of a secondary battery;
a communication terminal for providing a communication interface with the charge/discharge device;
a power supply for receiving electrical power from the secondary battery and supplying the electrical power to a component through the connector;
a power supply line including a power supply switch and supplying or cutting off the power from the secondary battery to the power supply;
a switch controller connected to the communication terminal and configured to transmit a turn-on signal to the power supply switch when receiving a communication request signal through the communication terminal and stop transmitting the turn-on signal to the power supply switch when not detecting the reception of the communication request signal; and
a controller connected to the power supply and initiating or terminating a management operation for the secondary battery according to whether or not the power is provided from the power supply.

* * * * *